United States Patent [19]

Abe

[11] Patent Number: 5,473,258
[45] Date of Patent: Dec. 5, 1995

[54] PROBE APPARATUS FOR CARRYING AWAY DUST CREATED BY PROBE TESTING

[75] Inventor: Yuuichi Abe, Tokyo, Japan

[73] Assignee: Tokyo Electron Limited, Tokyo, Japan

[21] Appl. No.: 294,613

[22] Filed: Aug. 23, 1994

Related U.S. Application Data

[63] Continuation of Ser. No. 922,384, Jul. 31, 1992, abandoned.

[30] Foreign Application Priority Data

Aug. 2, 1991  [JP]  Japan ................................... 3-194246
Aug. 2, 1991  [JP]  Japan ................................... 3-194247

[51] Int. Cl.[6] ........................... F25b 49/00; G01R 31/26
[52] U.S. Cl. ....................... 324/754; 432/241; 165/80.4; 62/126; 414/222
[58] Field of Search ............................. 432/241; 55/358; 324/754; 165/80.4; 358/107, 108; 62/126

[56] References Cited

U.S. PATENT DOCUMENTS

| | | | |
|---|---|---|---|
| 3,728,866 | 4/1973 | Layton | 62/126 |
| 4,427,427 | 1/1984 | DeVecchi | 55/358 |
| 4,981,436 | 1/1991 | Watanabe | 432/241 |
| 5,086,270 | 2/1992 | Karasawa et al. | 324/158 P |

FOREIGN PATENT DOCUMENTS

| | | |
|---|---|---|
| 63-151036 | 6/1988 | Japan . |
| 4-24935 | 1/1992 | Japan . |

*Primary Examiner*—Kenneth A. Wieder
*Assistant Examiner*—Barry C. Bowser
*Attorney, Agent, or Firm*—Oblon, Spivak, McClelland, Maier & Neustadt

[57] ABSTRACT

A probe apparatus comprises a housing, a probing mechanism arranged in the housing and including a supporting table for supporting an object having electrodes and movably arranged to locate the object at a measurement position, and probes which is brought into contact with the respective electrodes of the object supported by the supporting table, a load/unload mechanism arranged in the housing, for loading/unloading the object in/from the supporting table, and a downflow forming unit for forming a downflow of clean air flowing from an upper position to a lower position of the housing in every region inside the housing.

20 Claims, 6 Drawing Sheets

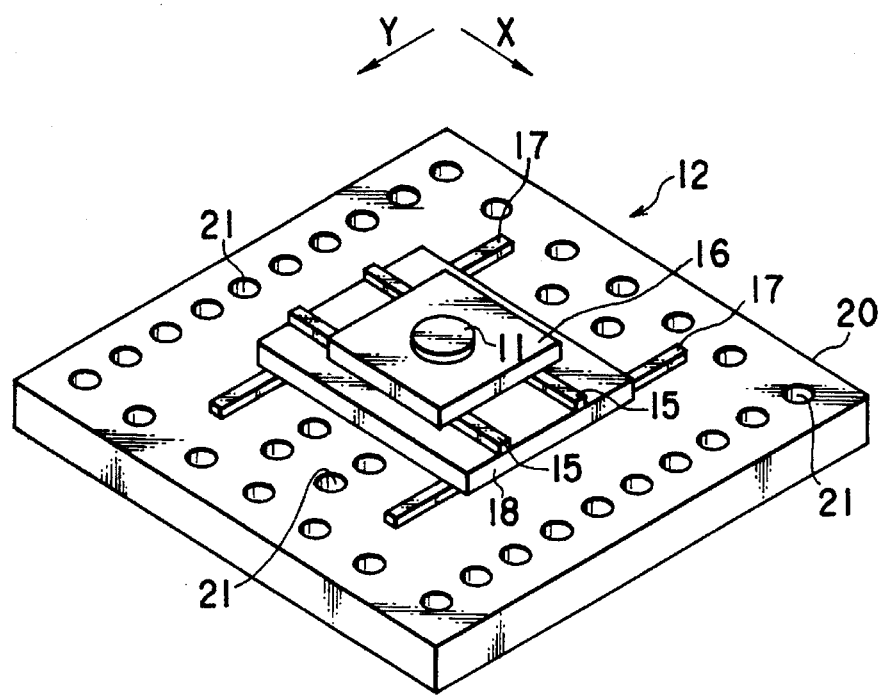
F I G. 3
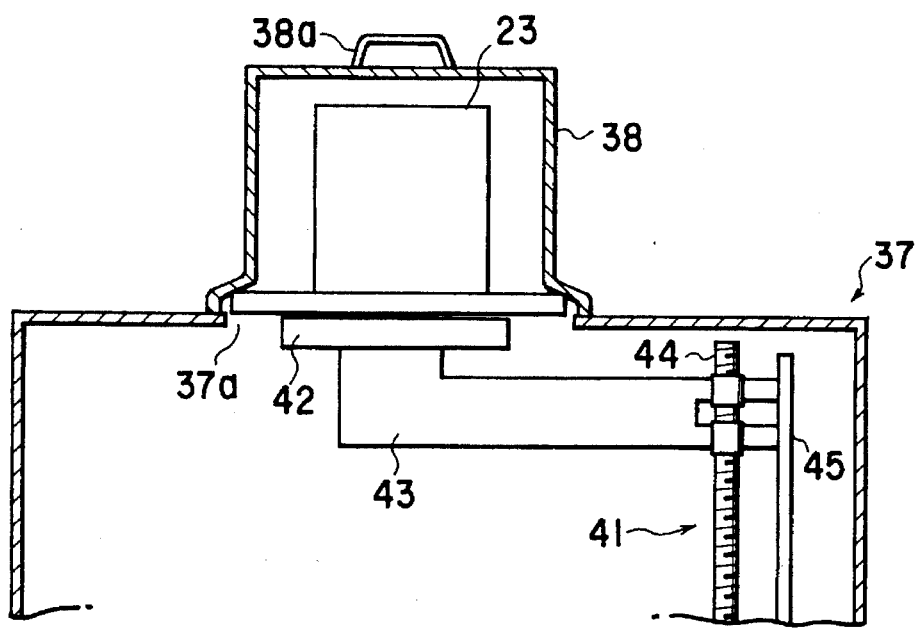
F I G. 4

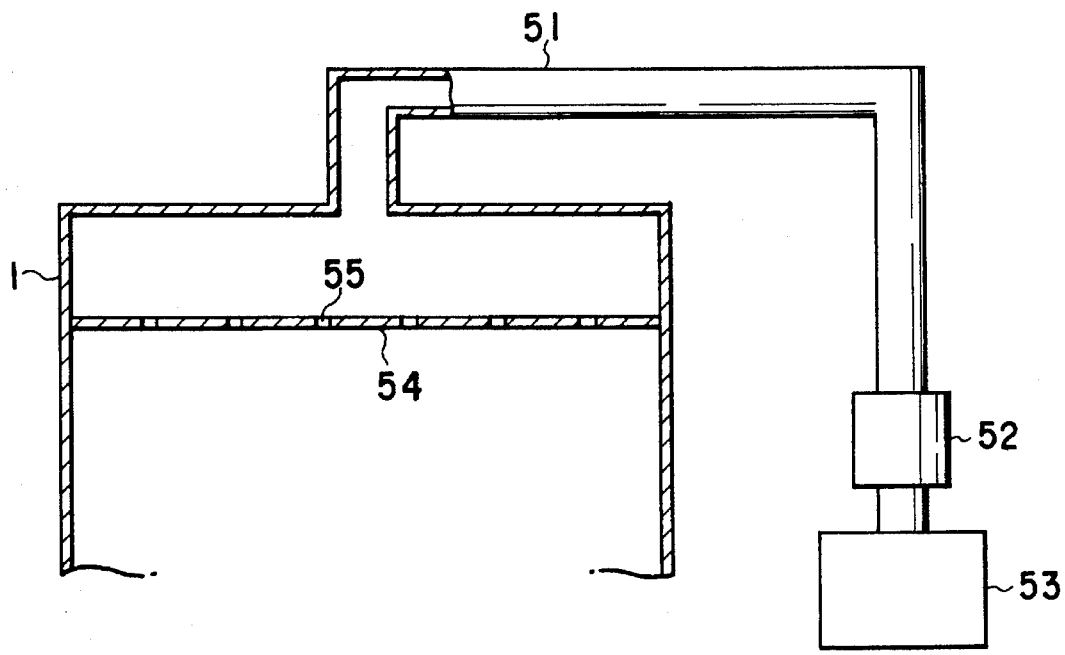
F I G. 6
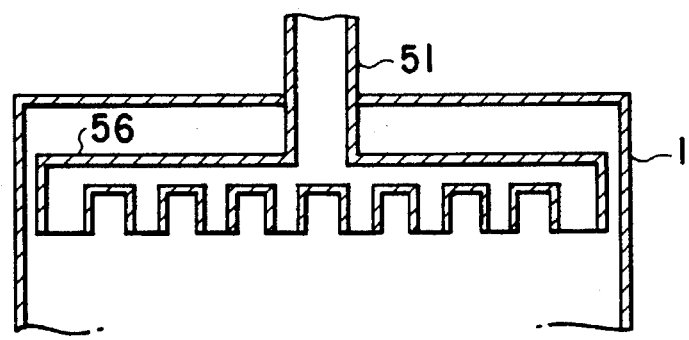
F I G. 7

PROBE APPARATUS FOR CARRYING AWAY DUST CREATED BY PROBE TESTING

This application is a Continuation of application Ser. No. 07/922,384, filed on Aug. 31, 1992, now abandoned.

BACKGROUND OF THE INVENTION

1. Field of the Invention

The present invention relates to a probe apparatus for measuring electric characteristics of an object such as a semiconductor wafer.

2. Description of the Related Art

In a process of manufacturing semiconductor devices, a number of semiconductor devices are formed on a semiconductor wafer using a precision photograph transfer technology, and the wafer is diced to separate the semiconductor devices from one another. In this process, the electric characteristics of semi-finished semiconductor devices are measured using a probe apparatus when they are formed on the semiconductor wafer, and only defect-free devices of the semi-finished semiconductor devices are sent to the succeeding process such as a packaging process, thereby improving productivity of the semiconductor devices.

The probe apparatus includes a wafer holding table movably in the X, Y and Z directions. A probe card having a number of probes corresponding to electrode pads of the semiconductor devices is fixed onto the wafer supporting table. The semiconductor wafer is placed on the wafer supporting table, and the wafer supporting table is driven to bring the probes into contact with the electrode pads of the semiconductor devices, thereby testing the semiconductor devices using a tester and measuring their characteristics by the probes.

Since a miniaturized circuit pattern has to be formed in the semiconductor device manufacturing process described above, dust in an atmosphere adheres to the semiconductor wafer and causes defective semiconductor devices. For this reason, the semiconductor devices are usually manufactured in a clean room in which a downflow of clean air is generated. The probe apparatus is installed in the clean room and the characteristics of the semiconductor devices are measured.

Since, however, the construction cost of a clean room is high per floor area, it is desirable that the number of apparatuses installed in the clean room be as few as possible. Further, since people tend to generate dust, it is desirable that as few operators as possible enter the clean room.

Usually, the surface of the electrode pad of the semiconductor device comes into contact with air to form an oxide film thereon. The distal end of the each probe of the probe apparatus slides along the surface of the electrode pad, and the oxide film is removed by the distal end of the probe, with the result that the electrode pad and the probe are brought into electrical contact with each other. However, the following problem will arise. There is a strong possibility that the removed oxide floats as dust and adheres to an undesired portion. To eliminate this problem, a technique of preventing the adhesion of dust by forming a downflow of air in a region for mounting the semiconductor wafer is proposed in Published Unexamined Japanese Patent Application No. 63-151036. Even though this technique is adopted, an effect of preventing the adhesion of dust cannot be sufficiently obtained.

SUMMARY OF THE INVENTION

The present invention has been developed in consideration of the above situation and its object is to provide a probe apparatus capable of measuring electrical characteristics of an object in a normal atmosphere outside a clean room and greatly reducing a possibility of adhesion of dust to an undesired portion.

According to an aspect of the present invention, there is provided a probe apparatus comprising:

a housing;

a probing mechanism arranged in the housing and including a supporting table for supporting an object having an electrodes and movably arranged to locate the object at a measurement position, and probes which are brought into contact with the respective electrodes of the object supported by the supporting table;

load/unload means arranged in the housing, for loading/unloading the object in/from the supporting table; and downflow forming means for forming a downflow of clean air flowing from an upper position to a lower position of the housing in every region inside the housing.

According to another aspect of the present invention, there is provided a probe apparatus comprising:

a housing;

a probing mechanism arranged in the housing and including a supporting table for supporting an object having electrodes and movably arranged to locate the object at a measurement position, and probes which is brought into contact with the respective electrodes of the object supported by the supporting table;

load/unload means arranged in the housing, for loading/unloading the object in/from the supporting table;

downflow forming means for forming a downflow of clean air flowing from an upper position to a lower position of the housing in every region inside the housing;

a power supply unit for driving the probe apparatus; and an electronic circuit unit for controlling driving of the probe apparatus, wherein the power supply unit and the electronic circuit unit are arranged outside the housing.

According to still another aspect of the present invention, there is provided a probe apparatus comprising:

a housing;

a probing mechanism arranged in the housing and including a supporting table for supporting an object having an electrodes and movably arranged to locate the object at a measurement position, and probes which is brought into contact with the respective electrodes of the object supported by the supporting table;

load/unload means arranged in the housing, for loading/unloading the object in/from the supporting table; and downflow forming means for forming a downflow of clean air flowing from an upper position to a lower position of the housing in every region inside the housing, wherein the downflow forming means is integrally formed with the housing as a single component.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a perspective view of an X-Y table used in the probe apparatus shown in FIG. 1;

FIG. 4 is a cross-sectional view of an example of a wafer carrying mechanism;

FIG. 6 is a cross-sectional view of a modification to a downflow forming mechanism;

FIG. 7 is a cross-sectional view of another modification to the downflow forming mechanism.

DETAILED DESCRIPTION OF THE PREFERRED EMBODIMENTS

Figure 1:
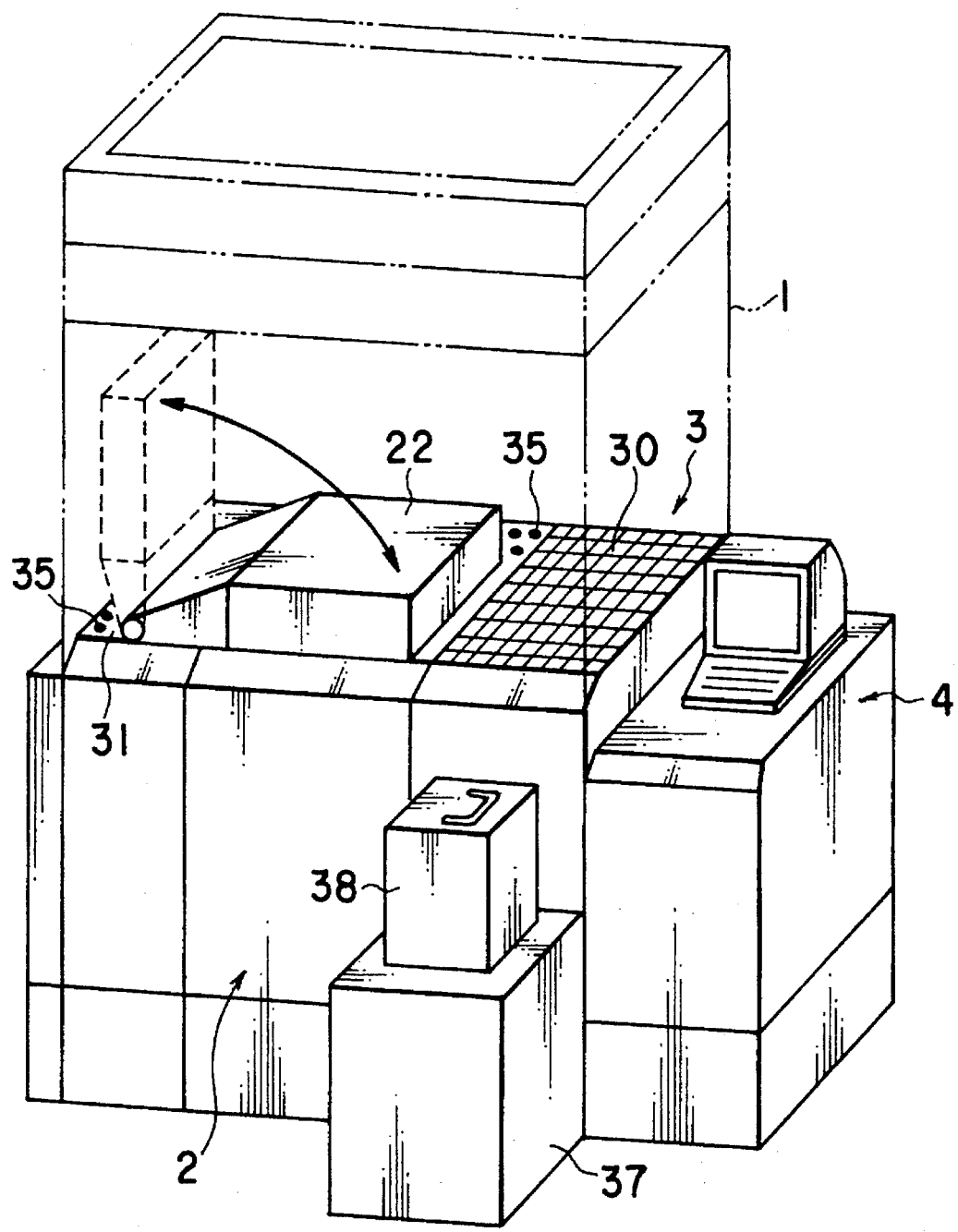
FIG. 1 is a perspective view of a probe apparatus according to a first embodiment of the present invention.
Figure 2:
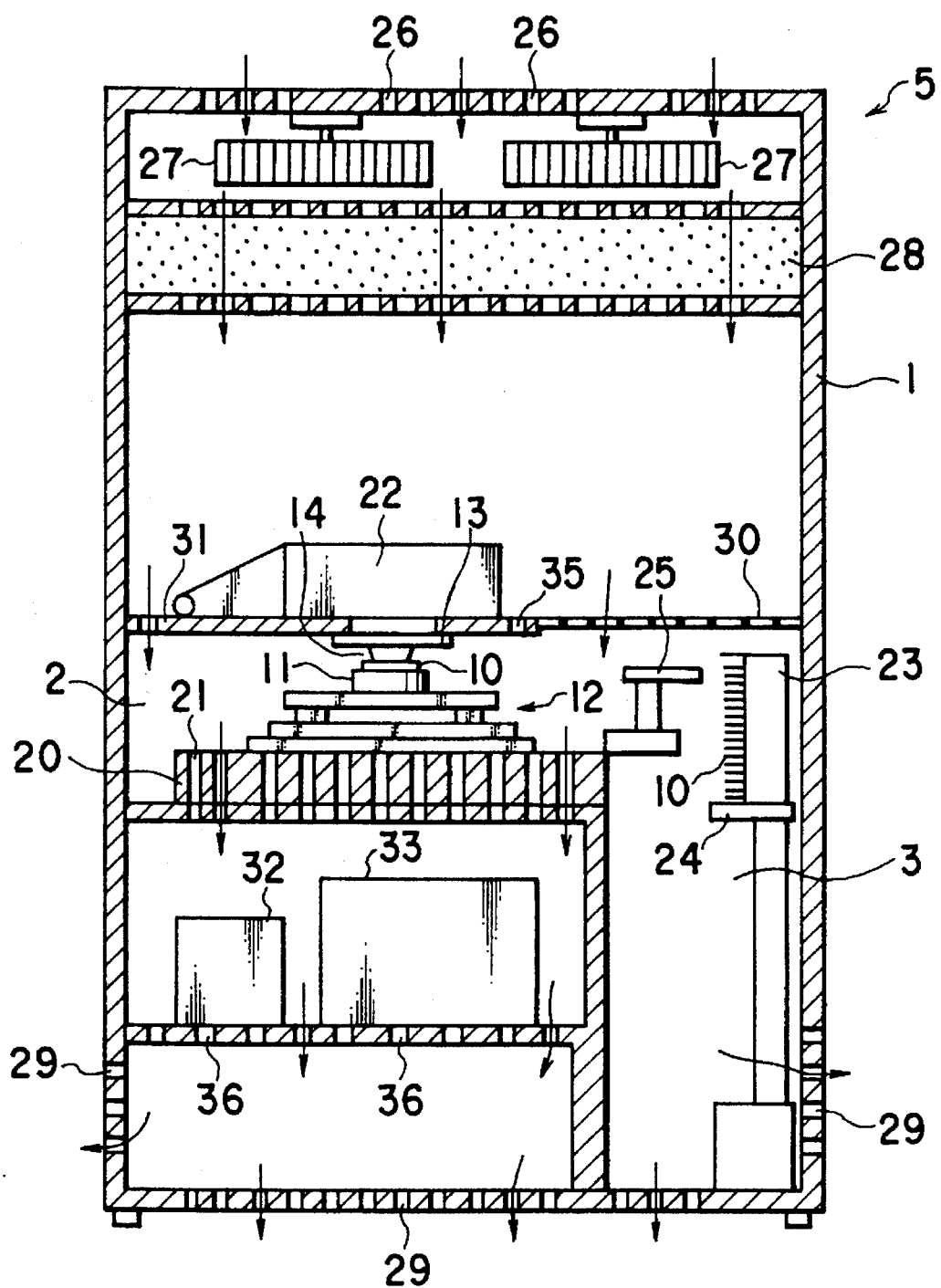
FIG. 2 is a cross-sectional view of the probe apparatus shown in FIG. 1.

FIG. 1 is a perspective view of a probe apparatus according to a first embodiment of the present invention, and FIG. 2 is a cross-sectional view thereof. The probe apparatus includes a housing 1 formed of, for example, metal, and is almost rectangular. The sidewalls of the housing 1 are airtightly formed to prevent air containing dust and the like from flowing from an undesired portion.

The housing 1 includes a probing mechanism 2 and an automatic loading unit 3. An operation unit 4 is provided on one side of the housing 1. The operation unit 4 includes a console terminal connected to respective devices in the housing 1 through cables (not shown), a display, a keyboard, etc. and is used to operate the devices from outside the housing 1.

As is shown in FIG. 2, the probing mechanism 2 includes a wafer holding table 11 for adsorbing and holding a semiconductor wafer 10 by, for example, vacuum chuck capable of moving the semiconductor wafer 10 in a Z direction (up-and-down direction), and an X-Y table 12 for moving the wafer supporting table 11 in X and Y directions. Probes 14 of a probe card 13 fixed above the wafer holding table 11, are brought into contact with electrode pads of a semiconductor device formed on the semiconductor wafer 10.

As is shown in FIG. 3, the X-Y table 12 includes an X-direction driving mechanism having X-direction driving rails 15 and an X-direction movable plate 16 formed on the X-direction driving rails 15, and a Y-direction driving mechanism having Y-direction driving rails 17 and a Y-direction movable plate 18 formed on the Y-direction driving rails 17. The Y-direction driving mechanism is placed on a sturdy base plate 20 constituted by, for example, a cast plate, and the X-direction driving mechanism is then placed on the Y-direction driving mechanism. A plurality of vents 21 through which a downflow formed in the housing 1 passes, which will be described later, are formed in the base plate 20.

A test head 22 is pivotally provided above the probing mechanism 2. As indicated by the arrow shown in FIG. 1, the test head 22 is placed on the probing mechanism 2 in measuring electric characteristics of an object, and it is pivotally moved in maintenance, for example, in exchanging the probe card 13 with another one. Thus, a space for the maintenance can be formed above the probe card 13.

Note that a tester (not shown) provided by the user is connected to the test head 22, and the electric characteristics of the semiconductor devices are measured by the tester.

The automatic loading unit 3 arranged on one side of the probing mechanism 2, includes a cassette elevator 24 for up and down movement of a wafer cassette 23. The elevator 24 is capable of storing a plurality of semiconductor wafers 10, for example, 25 semiconductor wafers. A wafer carrying mechanism 25 for carries the semiconductor wafer 10 between the wafer cassette 23 on the cassette elevator 24 comprising an the wafer supporting table 11 and loading/unloading operation. Though FIG. 2 shows only one cassette elevator 24, the probe apparatus usually includes a plurality of cassette elevators.

A downflow forming mechanism 5 is provided on the top of the housing 1, and includes: a plurality of air inlets 26 for letting air in the housing 1; fans 27 for letting the air therein; and a filter 28 for removing dust from the air and purifying the air. The purified air is let in the housing 1 to form a downflow of the purified air flowing from the upper position to the lower position of the housing 1 in every region inside the housing 1. For example, a ULPA filter (trademark) can be used as a filter 28.

A plurality of exhaust holes 29 are formed on the bottom and lower sides of the housing 1, and the air let in the housing 1 is exhausted through the exhaust holes 29. In addition to the vents 21 of the base plate 20, openings through which the air of the downflow passes, are formed in the respective components arranged in the housing 1. More specifically, a top plate 30 of the automatic loading unit 3 is constituted by a mesh member to form vents. Both a top plate 31 of the probing mechanism 2 and a supporting plate 34 for supporting a power supply unit 32 and an electronic circuit unit 33 also have vents 35 and 36, respectively. The power supply unit 32 is constituted by a power supply for driving the probe apparatus and a housing for housing the power supply, and the electronic circuit unit 33 is constituted by a plurality of electronic circuit boards for controlling the operations of the probing mechanism 2 and automatic loading unit 3, and a housing for housing these electronic circuit boards.

The fans 27 are rotated, and air is let in through the air inlets and cleaned by the filter 28, as indicated by the arrows shown in FIG. 2. The clean air passes through the vents 21, 35, and 36, the mesh top plate 31, and the respective components of the housing 1, and then exhausted from the exhaust holes 29 outside the apparatus. In other words, the probe apparatus is so constructed that a downflow of the purified air similar to that of a clean room is formed in the housing 1 and a purified atmosphere is produced in the housing 1. Note that exhaust fans can be provided near the exhaust holes 29.

As is shown in FIG. 1, a cassette carrying mechanism 37 is provided in front of the housing 1. When an airtight container 38 containing the wafer cassette 23 is placed on the cassette carrying mechanism, an opening/closing mechanism arranged at the lower portion of the airtight container 38 is opened to carry the wafer cassette 23 to the cassette elevator 24. Further, the opening/closing mechanism is opened to carry the wafer cassette 23 storing the semiconductor wafers 10, which have been tested, from the cassette elevator 24 to the airtight container 38. For example, an SMIF system (trademark of MBK Assist Co., Ltd.) can be used as the cassette carrying mechanism 37 and airtight container 38. The SMIF system is disclosed in U.S. Pat. No. 4,534,389 and has a structure as shown in FIG. 4. In FIG. 4, the airtight container 38 and the wafer cassette 23 are detachably attached to each other by means of a lock mechanism (not shown), and the lock mechanism is in the ON-state. The wafer cassette is carried, together with the airtight container 38, by holding a handle 38a. The airtight container 38 is thus set on that portion of the top wall of the cassette carrying mechanism 37, in which a carrying opening 37a is formed. A gap between the airtight container 38 and the top wall of the cassette carrying mechanism 37 is sealed, and the lock mechanism is released. The cassette carrying mechanism 37 includes a mounting table 42 for mounting the wafer cassette 23, an elevator mechanism 41 for hoisting or lowering the wafer cassette, and an arm 43 for connecting the mounting table with the elevator mechanism 41. The elevator mechanism 41 has a ball screw 44 and a guide 45. The arm 43 is fit into the ball screw 44 and attached to the guide 45 so that it can be slid up and down. The ball screw 44 is rotated by a drive mechanism (not shown), the arm 43 is raised or lowered, and the wafer cassette 23 is raised or lowered accordingly. With the cassette carrying mechanism 37 so constructed, the wafer cassette 23 is carried between the airtight container 38 and the automatic loading unit 3.

The probe apparatus having the above structure is installed in a normal atmosphere outside the clean room. If the fans 27 are rotated, air is let in from the air inlets 26 and passes through the filter 28, with the result that a downflow of purified air substantially equal to that of the clean room is formed in the entire region of housing 1. Therefore, a purified atmosphere is kept in the housing 1. As described above, since the operation of the probe apparatus can be performed by the operation unit 4 provided outside the housing 1, the purified atmosphere in the housing 1 cannot be degraded when the operation is performed.

The semiconductor wafer 10 to be tested is sent from the clean room to the airtight container 38, then carried to the normal atmosphere in the airtight state, and set on the cassette carrying mechanism 37.

The wafer cassette 23 is removed from the airtight container 38 and set on the cassette elevator 24 by the cassette carrying mechanism 37. The semiconductor wafer 10 can thus be carried from the clean room into the housing 1 of the purified atmosphere, without being exposed to air of outside. Further, dust can be prevented from entering the housing 1 from outside.

The wafer cassette 23 is moved up and down by the cassette elevator 24, and the semiconductor wafers 10 in the wafer cassette 23 are loaded onto the supporting table 11 one by one by means of the wafer carrying mechanism 25 to drive the wafer supporting table 11. The probes 14 of the probe card 13 are brought into contact with the electrode pads of semiconductor devices formed on the semiconductor wafer 10, the probes 14 and the pads become electrically conductive, and the electric characteristics of the semiconductor devices are automatically measured by the tester. The wafer 10 including the semiconductor devices which have been tested is unloaded from the wafer supporting table 11 and carried into the wafer cassette 23 by the wafer carrying mechanism 25.

As described above, the probe apparatus according to the first embodiment is installed in the normal atmosphere and allows the electric characteristics of semiconductor devices formed on the semiconductor wafer 10 to be measured in the normal atmosphere. For example, the measurement other than in the normal manufacturing process, such as the measurement for evaluation of design and process control, can be performed in the normal atmosphere by the probe apparatus. The clean room whose construction cost is high per floor area can be effectively used, and the number of entrances of operators, who cause dust to be generated, into the clean room can be decreased.

Since the downflow of clean air is formed in the entire region of housing 1 by the downflow forming mechanism 5, dust generated from the oxide film of the semiconductor wafer cut by the distal end of the probe when the electric characteristics of the semiconductor devices are measured, can be quickly removed.

As described above, the vents through which the downflow air passes, are formed in the members provided in the housing 1. For example, the vents 21 are formed in the base plate 20 of the X-Y table 12, the vents 35 are formed in the top plate 31 of the probing mechanism unit 2, and the vents 36 are formed in the supporting plate 34. The top plate 30 of the automatic loading unit 3 is formed like a mesh. The exhaust holes 29 are formed on the housing 1. Since the frequency of apertures in the housing 1 are increased, and air is exhausted from the exhaust holes 29 of the housing 1, the downflow of clean air is effectively formed in the entire housing 1, and the dust of the oxide film of the semiconductor wafer can be removed more quickly. Consequently, the cleanness of the inside of the probe apparatus can be remarkably improved, and the possibility of adhesion of dust to an undesired portion of the semiconductor wafer 10 can be greatly reduced. It is desirable that a total area of the vents of the members are 80% or more of the area of the bottom of the housing.

Figure 5:
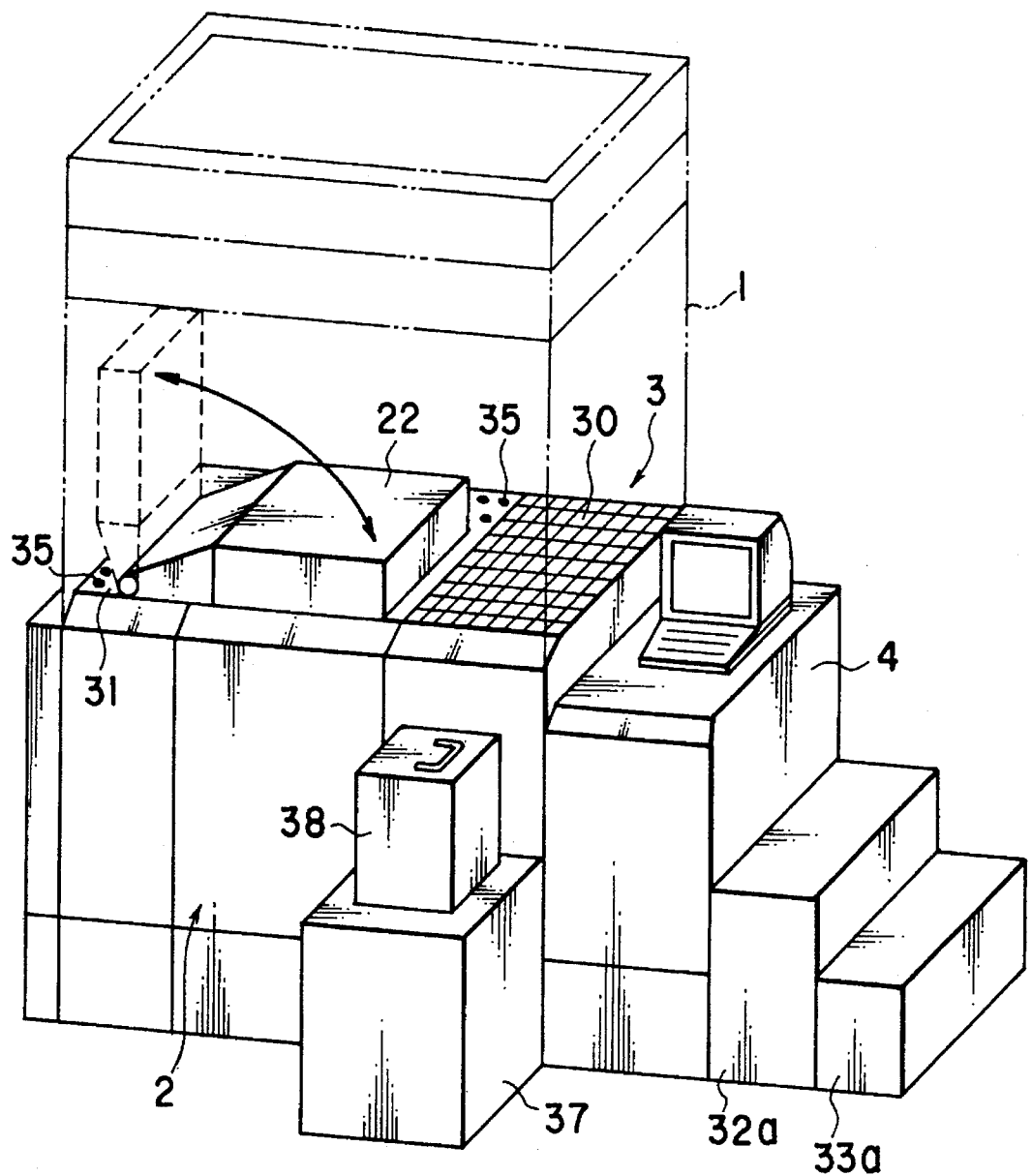
FIG. 5 is a perspective view of a probe apparatus according to a second embodiment of the present invention.

A probe apparatus according to a second embodiment of the present invention will now be described. FIG. 5 is a perspective view of the probe apparatus according to the second embodiment. In FIG. 5, the same structural elements as those in FIG. 1 are denoted by the same reference numerals and their descriptions are omitted.

The second embodiment differs from the first embodiment in that the power supply unit and electronic circuit unit are arranged outside the housing. As is shown in FIG. 5, a power supply unit 32a and an electronic circuit unit 33a are arranged close to the operation unit 4 outside the housing 1. With these units 32a and 33a arranged outside the housing 1, an area occupied by the power supply unit 32 and electronic circuit unit 33 shown in FIG. 1 becomes space. Since the power supply unit 32 and electronic circuit unit 33 shown in FIG. 1 prevent the downflow air from circulating and generate heat, if they are arranged outside the housing 1 as shown in FIG. 5, the downflow air can efficiently circulate in the respective members in the housing 1, the possibility of adhesion of dust to an undesired portion can be reduced more greatly, and the temperature in the housing 1 can be prevented from increasing.

In the above embodiments, the wafer cassette 23 is automatically removed from the airtight container 38 by the cassette carrying mechanism 37, without being exposed to air of outside. However, the carriage of the wafer cassette 23 into the housing 1 can be performed by hand and, in this case, a door through which the wafer cassette 23 is carried from/to the housing 1 has to be provided so that it can be opened and closed. If an air curtain mechanism, which is operated only when the door is opened, is provided at the door, dust can be prevented from entering the housing 1 when the wafer cassette 23 is carried into the housing through the door.

The present invention is not limited to the downflow forming mechanism of the above embodiments, but can be applied to that shown in FIG. 6. In the downflow forming mechanism shown in FIG. 6, one end of a pipe 51 is connected to the top of the housing 1, and the other end of the pipe 51 is connected to a blower 53. A filter 52 is provided on the pipe 51. A diffusion plate 54 having a plurality of vents 55 is formed in the upper portion of the housing 1. With the downflow forming mechanism so constructed, air flowing from the blower 53 is cleaned by the filter 52, and the clean air is guided into the housing 1 through the pipe 51 and diffused as downflow air by the diffusion plate 54. Furthermore, the present invention can be applied to a downflow forming mechanism shown in FIG. 7 which includes a pipe 56 having a plurality of downward exits, in place of the diffusion plate 54 shown in FIG. 6.

Figure 8:
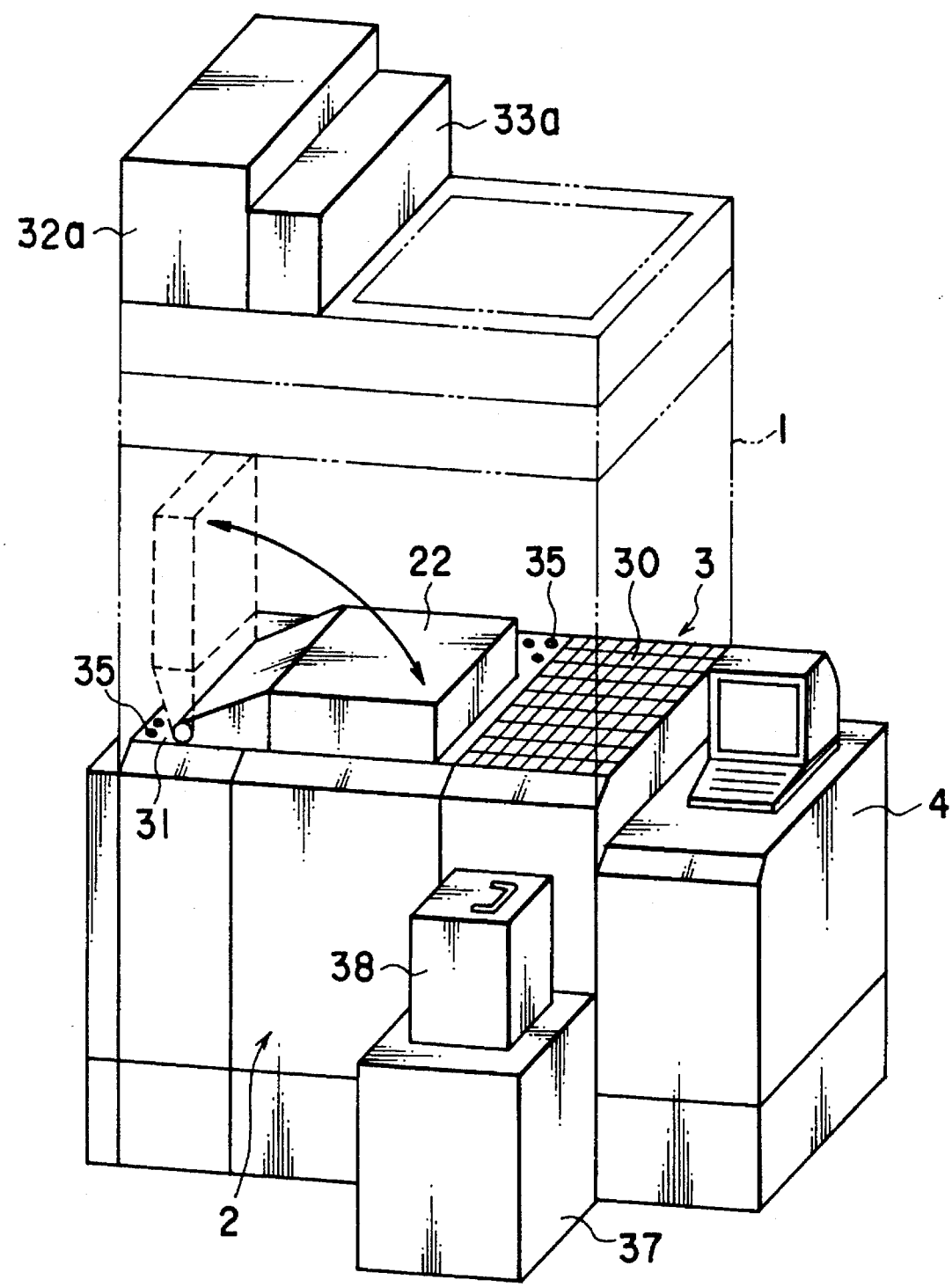
FIG. 8 is a perspective view of a modification to the probe apparatus shown in FIG. 5.

In the second embodiment, the power supply unit 32a and electronic circuit unit 33a are arranged close to the operation unit 4. However, as shown in FIG. 8, these units can be mounted on the top of the housing 1. While the space for them can be decreased, the maintenance thereof is somewhat difficult.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A probe apparatus for measuring electric characteristics of an object to be tested having electrodes, comprising:

a probing mechanism including a supporting table for supporting the object and movably arranged to locate the object at a measurement position, and probes which are brought into contact with the respective electrodes of the object supported by said supporting table;

a casing enclosing said probing mechanism therein, and having an air inlet provided on a top of the casing and an air exhaust port provided in at least a bottom portion thereof;

load/unload means arranged in said casing, for loading/unloading the object in/from the supporting table;

clean air supplying means for supplying clean air from said inlet into said casing in every region inside said casing, thereby creating a downflow of clean air flowing from an upper position to a lower position of said casing in every region inside said casing; and wherein, dust particles created by the probes contacting the electrodes of the object are blown by the downflow of clean air and away from the object.

2. The probe apparatus according to claim 1, wherein at least one of members constituting said probing mechanism and said load/unload means arranged in said casing has vents through which the clean air passes, and said exhaust port has exhaust holes.

3. The probe apparatus according to claim 1, further comprising an operation unit for operating said probe apparatus, said operation unit being arranged outside said casing.

4. The probe apparatus according to claim 1, wherein said clean air supplying means includes a fan for letting the clean air from said air inlet into said casing and flowing the clean air downward, and a filter arranged in said casing, for supplying the clean air to every region in said casing in the state of the downflow.

5. The probe apparatus according to claim 1, wherein said clean air supplying means includes a blower, filters for cleaning air supplied from said blower, a pipe for guiding the cleaned air from said inlet into said casing, and diffusion means for forming a downflow of the air guided into every region in said casing in the state of the downflow.

6. The probe apparatus according to claim 1, further comprising a carrying unit for carrying the object to said load/unload means, said carrying unit including a containing unit communicating with said casing, a carrying mechanism contained in said container, and a mounting area where a container for containing the object is mounted in an airtight state, and said carrying mechanism carrying the object to said load/unload means.

7. A probe apparatus for measuring electric characteristics of an object to be tested having electrodes, comprising:

a probing mechanism including a supporting table for supporting the object and movably arranged to locate the object at a measurement position, and probes which are brought into contact with the respective electrodes of the object supported by said supporting table;

a casing enclosing said probing mechanism therein, and having an air inlet provided on a top of the casing and an air exhaust port provided in at least a bottom portion thereof;

load/unload means arranged in said casing, for loading/unloading the object in/from the supporting table;

clean air supplying means for supplying clean air from said inlet into said casing in every region inside said casing, thereby creating a downflow of clean air flowing from an upper position to a lower position of said casing in every region inside said casing;

a power supply unit for driving said probe apparatus;

an electronic circuit unit for controlling driving of said probe apparatus;

wherein said power supply unit and said electronic circuit unit are arranged outside said casing; and wherein, dust particles created by the probes contacting the electrodes of the object are blown by the downflow of clean air and away from the object.

8. The probe apparatus according to claim 7, wherein at least one of members constituting said probing mechanism and said load/unload means arranged in said casing has vents through which the clean air passes, and said exhaust portion has exhaust holes.

9. The probe apparatus of claim 7, wherein, the air inlet includes air filtering for filtering external air; and wherein, the casing, air inlet and air exhaust port completely seal the probe apparatus from external air.

10. The probe apparatus of claim 9, wherein the casing further comprises:

a first compartment between the air inlet and a filter, providing the air filtering, where the clean air supplying means is located;

a second compartment having translucent walls for containing a top portion of the probing mechanism which can be viewed from outside the casing, the second compartment extending from the first compartment to a top plate of the probing mechanism;

wherein, the first and the second compartments can be manually removed from the top plate of the probing mechanism, revealing the top portion of the probing mechanism, which swivels to a closed, testing position and to an open position, allowing a probe card of a probe test head to be replaced or repaired;

a third compartment containing the probing mechanism;

wherein, the probing mechanism extends the probes into an area where the electrodes can be contacted with the probes in the third compartment when the top portion of the probing mechanism is in the closed, testing position; and vents between the first, the second and the third compartments for allowing the downflow of air to pass through the probe apparatus.

11. A probe apparatus for measuring electric characteristics of an object to be tested having electrodes, comprising:

a probing mechanism including a supporting table for supporting the object and movably arranged to locate the object at a measurement position, and probes which are brought into contact with the respective electrodes of the object supported by said supporting table;

a casing enclosing said probing mechanism therein, and having an air inlet provided on a top of the casing and an air exhaust port provided in at least a bottom portion thereof;

load/unload means arranged in said casing, for loading/unloading the object in/from the supporting table;

clean air supplying means for supplying clean air from said inlet into said casing in every region inside said casing, thereby creating a downflow of clean air flowing from an upper position to a lower position of said casing in every region inside said casing;

wherein said clean air supplying means is integrally formed with said casing as a single component; and wherein, dust particles created by the probes contacting the electrodes of the object are blown by the downflow of clean air and away from the object.

12. The probe apparatus according to claim 11, wherein at least one of members constituting said probing mechanism and said load/unload means arranged in said casing has vents through which the clean air passes, and said exhaust portion has exhaust holes.

13. The probe apparatus according to claim 11, wherein said clean air supplying means includes a fan for letting the clean air from said air inlet into said casing and flowing the clean air downward, and a filter arranged in said casing, for supplying the clean air to every region in said casing in the state of the downflow.

14. The probe apparatus of claim 11, wherein, the air inlet includes air filtering for filtering external air; and wherein, the casing, air inlet and air exhaust port completely seal the probe apparatus from external air.

15. The probe apparatus of claim 14, wherein the casing further comprises:

a first compartment between the air inlet and a filter, providing the air filtering, where the clean air supplying means is located;

a second compartment having translucent walls for containing a top portion of the probing mechanism which can be viewed from outside the casing, the second compartment extending from the first compartment to a top plate of the probing mechanism;

wherein, the first and the second compartments can be manually removed from the top plate of the probing mechanism, revealing the top portion of the probing mechanism, which swivels to a closed, testing position and to an open position, allowing a probe card of a probe test head to be replaced or repaired;

a third compartment containing the probing mechanism;

wherein, the probing mechanism extends the probes into an area where the electrodes can be contacted with the probes in the third compartment when the top portion of the probing mechanism is in the closed, testing position; and vents between the first, the second and the third compartments for allowing the downflow of air to pass through the probe apparatus.

16. A probe apparatus for measuring electric characteristics of an object to be tested having electrodes, comprising:

a probing mechanism including a supporting table for supporting the object and movably arranged to locate the object at a measurement position, and probes which are brought into contact with the respective electrodes of the object supported by said supporting table;

a casing enclosing said probing mechanism therein, and having an air inlet and an air exhaust port;

load/unload means arranged in said casing, for loading/unloading the object in/from the supporting table;

clean air supplying means for supplying clean air from said inlet into said casing in every region inside said casing, thereby creating a flow of clean air in every region inside said casing and removing dust generated in said casing; and wherein, dust particles created by the probes contacting the electrodes of the object are blown by the flow of clean air and away from the object.

17. The probe apparatus of claim 16, wherein, the air inlet includes air filtering for filtering external air; and wherein, the casing, air inlet and air exhaust port completely seal the probe apparatus from external air.

18. The probe apparatus of claim 20, wherein the casing further comprises:

a first compartment between the air inlet and a filter, providing the air filtering, where the clean air supplying means is located;

a second compartment having translucent walls for containing a top portion of the probing mechanism which can be viewed from outside the casing, the second compartment extending from the first compartment to a top plate of the probing mechanism;

wherein, the first and the second compartments can be manually removed from the top plate of the probing mechanism, revealing the top portion of the probing mechanism, which swivels to a closed, testing position and to an open position, allowing a probe card of a probe test head to be replaced or repaired;

a third compartment containing the probing mechanism;

wherein, the probing mechanism extends the probes into an area where the electrodes can be contacted with the probes in the third compartment when the top portion of the probing mechanism is in the closed, testing position; and vents between the first, the second and the third compartments for allowing the downflow of air to pass through the probe apparatus.

19. The probe apparatus of claim 17, wherein the casing further comprises:

a first compartment between the air inlet and a filter, providing the air filtering, where the clean air supplying means is located;

a second compartment having translucent walls for containing a top portion of the probing mechanism which can be viewed from outside the casing, the second compartment extending from the first compartment to a top plate of the probing mechanism;

wherein, the first and the second compartments can be manually removed from the top plate of the probing mechanism, revealing the top portion of the probing mechanism, which swivels to a closed, testing position and to an open position, allowing a probe card of a probe test head to be replaced or repaired;

a third compartment containing the probing mechanism;

wherein, the probing mechanism extends the probes into an area where the electrodes can be contacted with the probes in the third compartment when the top portion of the probing mechanism is in the closed, testing position; and vents between the first, the second and the third compartments for allowing the downflow of air to pass through the probe apparatus.

20. The probe apparatus of claim 1, wherein, the air inlet includes air filtering for filtering external air; and wherein, the casing, air inlet and air exhaust port completely seal the probe apparatus from external air.

* * * * *